United States Patent
Leger et al.

(10) Patent No.: US 11,215,725 B2
(45) Date of Patent: Jan. 4, 2022

(54) SEISMIC PROCESSING WORKFLOW FOR ORTHOGONAL WIDE AZIMUTH 3D SURVEYS

(71) Applicant: Saudi Arabian Oil Company, Dhahran (SA)

(72) Inventors: Pierre Leger, Dhahran (SA); Fuhao Qin, Dhahran (SA)

(73) Assignee: Saudi Arabian Oil Company, Dhahran (SA)

(*) Notice: Subject to any disclaimer, the term of this patent is extended or adjusted under 35 U.S.C. 154(b) by 266 days.

(21) Appl. No.: 16/514,248

(22) Filed: Jul. 17, 2019

(65) Prior Publication Data

US 2021/0018640 A1 Jan. 21, 2021

(51) Int. Cl.
G01V 1/30 (2006.01)
G06F 30/20 (2020.01)
G01V 1/28 (2006.01)

(52) U.S. Cl.
CPC .............. *G01V 1/308* (2013.01); *G01V 1/282* (2013.01); *G06F 30/20* (2020.01); *G01V 2210/242* (2013.01); *G01V 2210/32* (2013.01); *G01V 2210/57* (2013.01)

(58) Field of Classification Search
CPC .. G01V 1/282; G01V 1/308; G01V 2210/242; G01V 2210/32; G01V 2210/57; G06F 30/20
See application file for complete search history.

(56) References Cited

U.S. PATENT DOCUMENTS

| | | | |
|---|---|---|---|
| 7,751,277 B2* | 7/2010 | Schonewille | G01V 1/36 367/38 |
| 8,811,156 B1* | 8/2014 | Jiang | H03M 7/3059 370/225 |
| 9,638,816 B2* | 5/2017 | Rentsch-Smith | G01V 1/364 |
| 10,345,468 B2* | 7/2019 | Poole | G01V 1/28 |

OTHER PUBLICATIONS

Ozbek et al., "Crossline wavefield reconstruction from multi-component streamer data: joint interpolation and 3D up/down separation by generalized matching pursuit," SEG Annual Meeting, Jan. 1, 2010, 5 pages.
Yu et al., "Wavelet-radon domain dealiasing and interpolation of seismic data," Geophysics, Mar. 2007, 72(2):V41-V49.

(Continued)

*Primary Examiner* — Elias Desta
(74) *Attorney, Agent, or Firm* — Fish & Richardson P.C.

(57) ABSTRACT

Disclosed are methods, systems, and computer-readable medium for a full seismic wavefield de-aliasing workflow. To achieve the de-aliasing, the workflow employs a four-dimension (4D) anti-leakage anti-aliasing regularization algorithm. The workflow involves application of successive de-aliasing steps while restricting computations only to the significant spatial dimensions. In areas of strong elastic property variation in the near-surface, the benefit of de-aliasing the full wavefield is both significant and demonstrable. In addition to achieving de-aliased sampling of the full wavefield, the workflow reduces the complexity of both the computational and geophysical aspects of the problem of de-aliasing full wavefields.

20 Claims, 14 Drawing Sheets
(10 of 14 Drawing Sheet(s) Filed in Color)

(56) References Cited

OTHER PUBLICATIONS

Zhang et al., "2D and 3D prestack seismic data regularization using an accelerated sparse time-invariant radon transform," Geophysics, Sep. 2014, 79(5):V165-V177.
PCT International Search Report and Written Opinion in International Appln. No. PCT/US2020/041967, dated Oct. 30, 2020, 14 pages.
Naghizadeh and Sacchi, "3D groundroll attenuation using hybrid Fourier and de-aliased Cadzow reconstruction," GeoConvention, May 2018, 4 pages.
Qin et al., "A robust implementation and application of antileakage Fourier transform interpolation," the Leading Edge, Jul. 2018.
Verma et al., "Highly aliased ground-roll suppression using a 3D multiwindow Karhunen-Loeve filter: Application to a legacy Mississippi Lime Survey," Geophysics vol. 81, 1, Jan.-Feb. 2016, 10 pages.
Xu et al., "Antileakage Fourier transform for seismic data regularization in higher dimensions," Geophysics vol. 75(6), Nov.-Dec. 2010, 8 pages.

\* cited by examiner

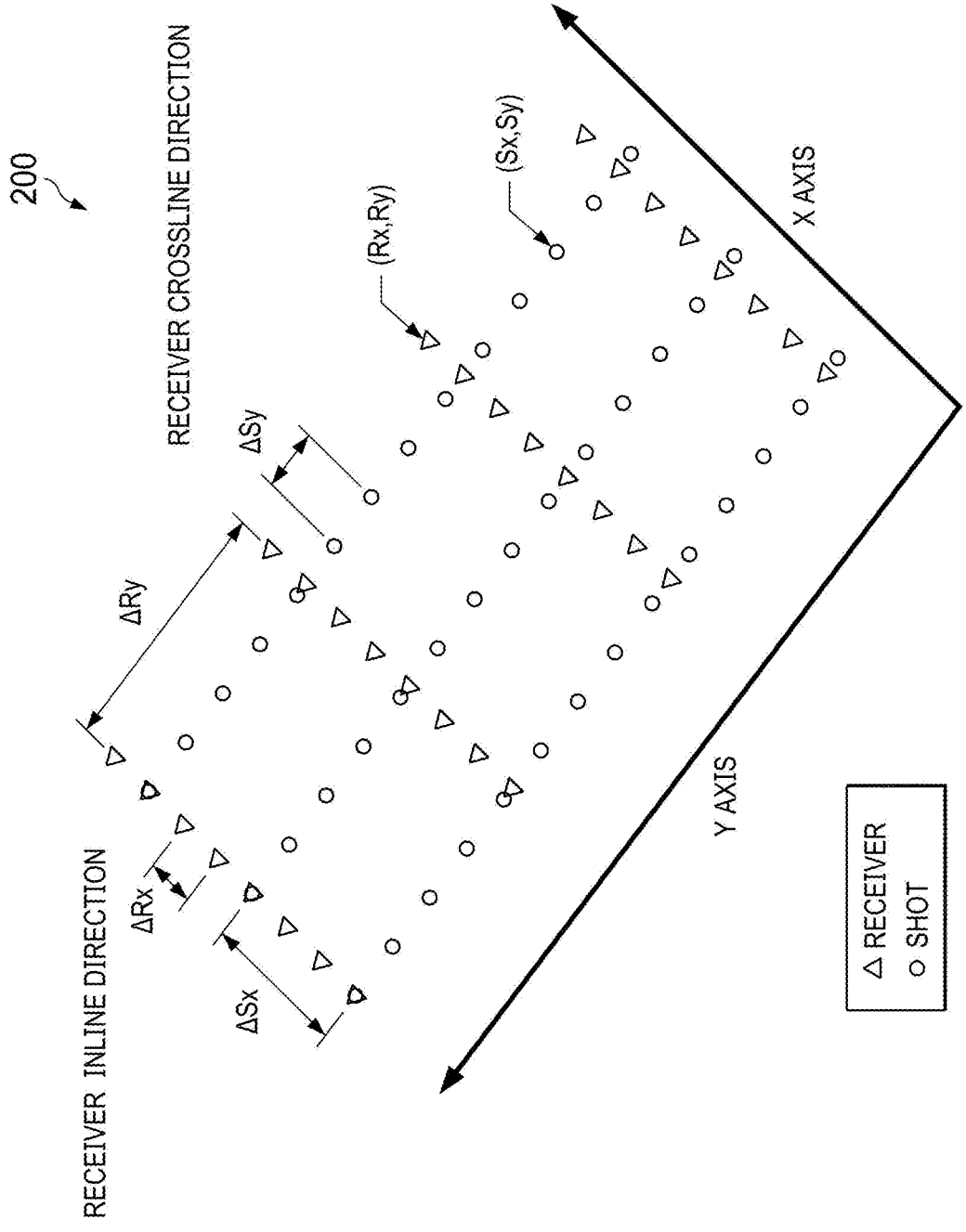

300

| 310 | APPLYING A FIRST PASS OF A 4-DIMENSIONAL (4D) REGULARIZATION TECHNIQUE TO A FIRST PLURALITY OF SUBSETS OF A SEISMIC SURVEY TO GENERATE FINELY SAMPLED REGULARIZED SEISMIC DATA |

| 312 | APPLYING A FIRST F-KX-KY ANTI-ALIAS DIP REJECT FILTER TO THE FINELY SAMPLED REGULARIZED SEISMIC DATA. |

| 314 | DECIMATING AN OUTPUT OF THE FIRST F-KX-KY DIP REJECT ANTI-ALIAS FILTER BACK TO AN EQUIVALENT FIELD SPACING OF Δ RECEIVER X AND Δ SHOT Y, THEREBY MAINTAINING A NEW REGULAR SPACING IN CROSSLINE OFFSET, INLINE OFFSET, AND RECEIVER X |

| 316 | SORTING THE DECIMATED SEISMIC DATA INTO A SECOND PLURALITY OF SUBSETS THAT SHARE A COMMON VALUE OF SHOT X |

| 318 | APPLYING A SECOND PASS OF THE 4D REGULARIZATION TECHNIQUE TO THE SECOND PLURALITY OF SUBSETS, THEREBY ACHIEVING REGULARIZATION OF THE FOURTH SPATIAL COORDINATE RECEIVER Y |

| 320 | SORTING THE SECOND PLURALITY OF SUBSETS OF THE 4D REGULARIZATION TECHNIQUE INTO A PLURALITY OF COMMON MIDPOINT (CMP) GATHERS |

| 322 | APPLYING, WITHIN THE CMP GATHER, A 3-DIMENSIONAL (3D) REGULARIZATION TECHNIQUE TO FURTHER REDUCE THE PREVIOUSLY REGULARIZED SAMPLING OF Δ CROSSLINE OFFSET AND Δ INLINE OFFSET |

| 324 | APPLYING A SECOND F-KX-KY DIP REJECT ANTI-ALIAS FILTER TO THE REGULARIZED CMP GATHERS |

| 326 | DECIMATING AN OUTPUT OF THE SECOND F-KX-KY FILTER BACK TO AN INLINE AND CROSSLINE OFFSET SAMPLING EQUAL TO TWICE A MINIMUM OF THE FIELD SPACINGS Δ SHOT X AND Δ RECEIVER Y TO CREATE FULL WAVEFORM DE-ALIASED GATHERS |

Figure 3

SEISMIC PROCESSING WORKFLOW FOR ORTHOGONAL WIDE AZIMUTH 3D SURVEYS

TECHNICAL FIELD

This disclosure relates to exploration seismology and, more specifically, to seismic data processing.

BACKGROUND

Certain types of seismic waves, such as direct and scattered surface waves, contain a significant amount of seismic energy. They present great challenges in land seismic data acquisition and processing, especially in arid regions with complex near-surface heterogeneities. Examples of near-surface heterogeneities include dry river beds, wadis/large escarpments, caves, carbonate rocks, karst features, and any abrupt change in the elastic properties of the earth material (for example, velocity and density) not only due to lithology changes but also can be due to other material property variations such as pressure and fluid saturations. In particular, the presence of complex near-surface heterogeneities overlaying relatively high velocity layers leads to the generation of strong near-surface noise that travels at low velocities. This resulting noise is strong and difficult to suppress due to inadequate spatial sampling. As a result, these arrivals are severely aliased even with the shot and geophone spacing of three-dimensional (3D) wide-azimuth seismic surveys.

SUMMARY

This disclosure is directed to a workflow for de-aliasing a full seismic wavefield. To achieve the de-aliasing, the workflow employs a four-dimension (4D) anti-leakage anti-aliasing regularization algorithm. The workflow involves application of successive de-aliasing steps while restricting computations only to the significant spatial dimensions. In areas of strong elastic property variation in the near-surface, the benefit of de-aliasing the full wavefield is both significant and demonstrable. In addition to achieving de-aliased sampling of the full wavefield, the workflow reduces the complexity of both the computational and geophysical aspects of the problem of de-aliasing full wavefields.

Aspects of the subject matter described in this specification may be embodied in methods that include the actions of: applying a first pass of a 4-dimensional (4D) regularization technique to a first plurality of subsets of a seismic survey to generate finely sampled regularized seismic data, where the first plurality of subsets includes piecewise continuous sets of seismic data recorded by a single receiver line, and where an output spacing of the first pass along a crossline offset dimension is set equal to both an output spacing of the first pass along an offset inline dimension and an output spacing of the first pass along a shot x dimension; applying a first F-Kx-Ky anti-alias dip reject filter to the finely sampled regularized seismic data; decimating an output of the first F-Kx-Ky dip reject anti-alias filter back to an equivalent field spacing of $\Delta$ receiver x and $\Delta$ shot y, thereby maintaining a new regular spacing in crossline offset, inline offset, and receiver x, where $\Delta$ crossline offset=$\Delta$ inline offset=$\Delta$ shot x=field $\Delta$ receiver x; sorting the decimated seismic data into a second plurality of subsets that share a common value of shot x; applying a second pass of the 4D regularization technique to the second plurality of subsets, thereby achieving regularization of the fourth spatial coordinate receiver y; sorting the second plurality of subsets of the 4D regularization technique into a plurality of common midpoint (CMP) gathers; applying, within a CMP gather, a 3-dimensional (3D) regularization technique to further reduce the previously regularized sampling of $\Delta$ crossline offset and $\Delta$ inline offset, where an output spacing along each regularized dimension is set equal to the field spacing $\Delta$ receiver x; applying a second F-Kx-Ky dip reject anti-alias filter to the regularized CMP gathers; an decimating an output of the second F-Kx-Ky filter back to an inline and crossline offset sampling equal to twice a minimum of the field spacings $\Delta$ shot x and $\Delta$ receiver y to create full waveform de-aliased gathers.

The previously-described implementation is implementable using a computer-implemented method; a non-transitory, computer-readable medium storing computer-readable instructions to perform the computer-implemented method; and a computer system comprising a computer memory interoperably coupled with a hardware processor configured to perform the computer-implemented method/the instructions stored on the non-transitory, computer-readable medium. These and other embodiments may each optionally include one or more of the following features.

In a first aspect, applying normal moveout (NMO) corrections to the seismic data prior to applying the first 4D regularization to the first portion of seismic data.

In a second aspect, where the first 4D regularization technique includes: regularizing shot x, offset crossline, and offset inline dimensions of the first seismic data, where: the offset crossline=(shot y−receiver y), and the offset inline=(receiver x−shot x).

In a third aspect, where the first 4D regularization technique further includes: based on regularized receiver x values, assigning output receiver y values based upon interpolating a table of receiver x and receiver y values extracted from the input dataset.

In a fourth aspect, where the first $F-K_x-K_y$ anti-alias dip reject filter is configured to filter low velocity surface waves.

In a fifth aspect, where applying the second 4D regularization technique to the subsets includes: regularizing receiver y, offset crossline, and offset inline dimensions of the subsets.

In a sixth aspect, where an output spacing of the regularized receiver y dimension is set equal to the output spacing of the regularized receiver x dimension.

In a seventh aspect, where the second $F-K_x-K_y$ anti-alias dip reject filter is configured to reject high apparent velocities.

In an eighth aspect, constructing a model of noise in the seismic data; and adaptively subtracting the noise from the seismic data.

The subject matter described in this specification can be implemented in particular implementations so as to realize one or more of the following advantages. First, the disclosed seismic processing workflow reduces the complexity of both the computational and geophysical aspects of the problem of de-aliasing full wavefields. Second, financial impact of the workflow is significant as the workflow is far less expensive alternative to field acquisition of the necessary sampling. Third, the incorporation of a velocity cut into the F-Kx-Ky anti-alias filters, provides, at no extra computational cost, an additional suppression of non P-wave energy, which improves the pre-stack signal to noise ratio.

While generally described as computer-implemented software embodied on tangible media that processes and transforms the respective data, some or all of the aspects may be computer-implemented methods or further included in respective systems or other devices for performing this described functionality. The details of these and other aspects and implementations of the present disclosure are set forth in the accompanying drawings and the following description. Other features and advantages of the disclosure will be apparent from the description and drawings, and from the claims.

BRIEF DESCRIPTION OF THE DRAWINGS

The patent or application file contains at least one drawing executed in color. Copies of this patent or patent application publication with color drawing(s) will be provided by the Office upon request and payment of the necessary fee.

FIG. 2 is a shot and receiver geometry for a three-dimensional (3D) wide-azimuth seismic acquisition (WAZ) land survey, according to some implementations of the present disclosure.

FIG. 3 is a flowchart of an example seismic processing workflow, according to some implementations of the present disclosure.

Like reference numbers and designations in the various drawings indicate like elements.

DETAILED DESCRIPTION

Figure 1:
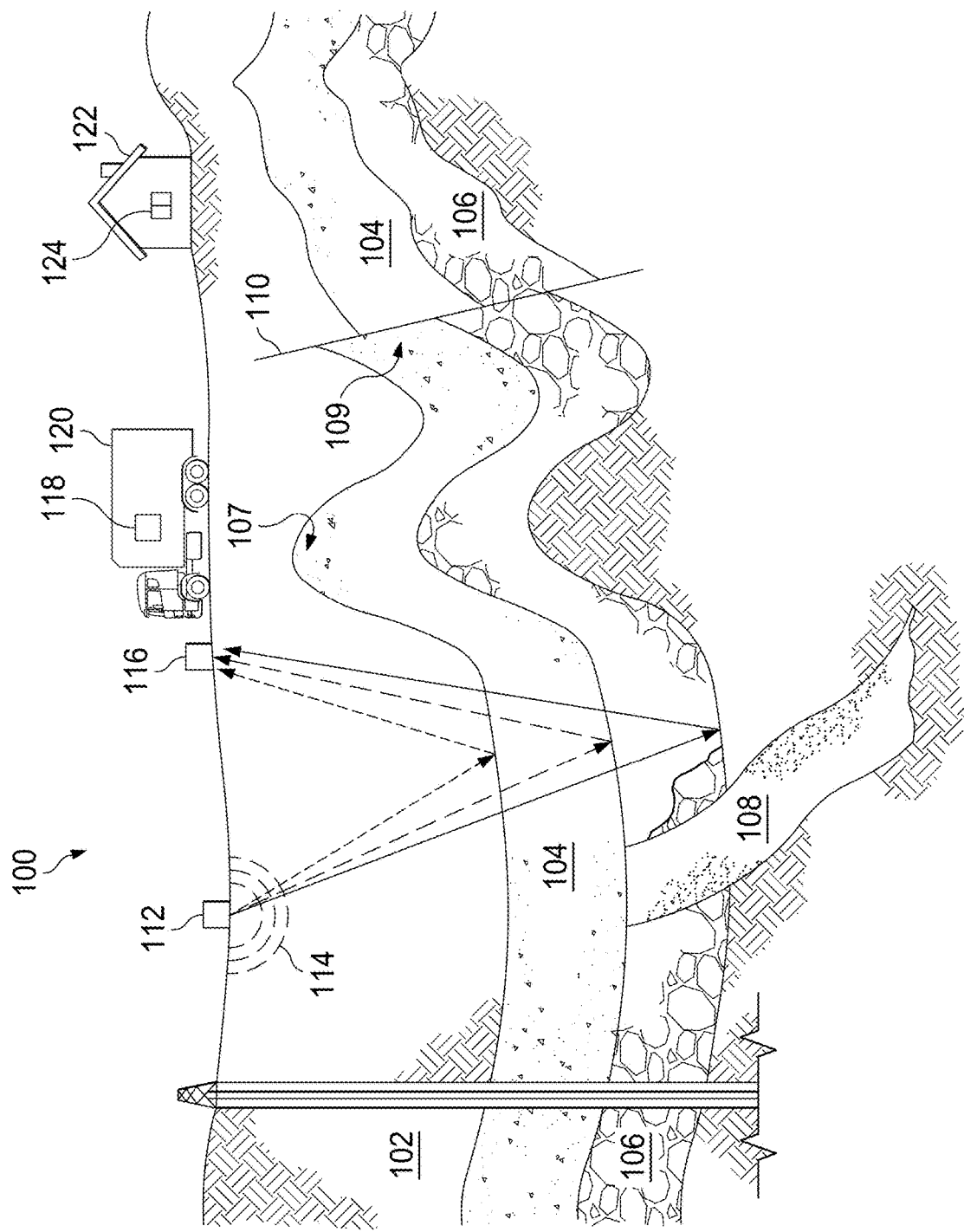
FIG. 1 is a schematic view of a seismic survey being performed to map subterranean features such as facies and faults, according to some implementations of the present disclosure.

Various modifications, alterations, and permutations of the disclosed implementations can be made and will be readily apparent to those skilled in the art, and the general principles defined may be applied to other implementations and applications without departing from the scope of the disclosure. Thus, the present disclosure is not intended to be limited to the described or illustrated implementations, but is to be accorded the widest scope consistent with the principles and features disclosed. Moreover specific parametrizations of the disclosed workflow are intended as guidance only and not to limit the scope of the workflow.

The following detailed description describes systems and methods for full wavefield de-aliasing, and is presented to enable a person skilled in the art to make and use the disclosed subject matter in the context of one or more particular implementations. For purposes of this disclosure, "near-surface" refers to the shallowest one wavelength depth from the Earth's surface. For example, in case of 30 Hertz (Hz) dominant frequency and 1800 meter/second (m/s) wave speed, the shallowest one wavelength is equivalent to the top 60 m depth from the Earth's surface. A "P-wave" denotes a primary or compressional wave, an "S-wave" denotes a secondary or shear wave, and "surface waves" refer to Rayleigh waves that are confined with propagation along the Earth's free surface. In this disclosure, "surface waves" also encompass other raypaths where propagation of the wavefield is within a segment of the raypath travel along an interface surface between two geologic formations.

The ultimate goal in exploration seismology is to obtain an optimum image of the subsurface to map reservoir boundaries (for example, structural mapping) and to characterize reservoir properties (for example, porosity, saturation, permeability, and fracture density and orientation) for field evaluation and development. Extracting and monitoring reservoir properties are essential steps for reservoir modeling, flow simulation studies, and for horizontal drilling to accomplish optimal recovery. These processes can be achieved by inverting formation elastic properties (for example, P-impedance, S-impedance, and density) from seismic data and by using rock physics information derived from core and log data to link between the rock and seismic elastic properties. However, in the real world, many factors affect the quality of seismic data. For example, surface topography and near-surface heterogeneities can significantly complicate the data with large static travel time variations, signal attenuation, and wave scattering. These factors can deteriorate the image quality and increase the uncertainty of subsurface images and formation properties.

Near-surface complexity and surface topography (for example, in arid environments) present major challenges to land seismic data acquisition and processing. These challenges can severely affect data quality and introduce uncertainty into reservoir imaging and characterization as the near-surface complexity and surface topography can severely contaminate the seismic data with complicated wave phenomena that cannot be accounted for by single layered models and conventional processing methods. Both the direct surface waves and the up-going reflections are scattered by the heterogeneities. These difficulties, added to large amplitude direct and back-scattered surface waves, create a major reduction in signal-to-noise ratio and degrade the final subsurface image quality. Also, strong contrast in velocity (and therefore impedance) between the near-surface and the substrata (for example, carbonate layers) may add to the complexity of the energy penetration, as most of the seismic energy is reflected and trapped near the surface, generating both internal and surface related multiples.

Therefore, in interpreting noise-contaminated data, the main challenges are caused by complex topographic and near-surface features, such as sand dunes, wadis/large escarpments, karsted carbonates, caves, dry river beds, and any abrupt change in the elastic properties of earth material (for example, velocity and density) not only due to lithology changes but also due to other material property variations such as pressure and fluid saturations.

Removing the seismic noise associated with the complex near-surface is challenging during data processing. Strong, slow-traveling noise energy obscures the primary reflection signal even after stacking of high fold data from seismic surveys. Technologies for linear noise removal are inadequate due to aliasing and the complexity of the combined surface wavefield. For example, direct application of velocity-based filtering in frequency-wavenumber (f-k) or Radon domains is not effective in suppressing this noise. Strong noise destroys the coherency of data needed for velocity picking and degrades the signal to noise ratio in the final stack. To effectively suppress the surface-related noise, seismic data needs to be interpolated to finer spacing to reduce aliasing. In particular, an effective data interpolation scheme has to be able to handle irregular input data, strong aliasing, and strong noise.

Disclosed herein is a multistage workflow for de-aliasing the full wavefield such that the two wavefields (reflection and surface) become largely separable. Doing so allows the surface-related noise to be suppressed or removed.

In a first stage of the workflow, an antialiasing de-noising process is applied to seismic data along sets of cross-spread domain gathers (where sampling is best). A spatial anti-alias filter is then applied to the output of the antialiased data. The spatial anti-alias filter incorporates safe dip suppression that rejects non P-wave energy travelling at a velocity less than the slowest P-wave reflection velocity of interest. In a second stage of the workflow, the antialiasing de-noising process is applied in the common midpoint (CMP) domain. A spatial anti-alias filter that incorporates dip suppression is then applied to CMP gathers. Since this filter is employed in the CMP domain on NMO corrected gathers, the velocity cut can be safely increased to high apparent velocities without affecting the P-wave reflection field. This achieves very significant non P-wave energy suppression.

This workflow yields a result called full-wavefield anti-aliased regularization. Full wavefield regularization, also referred to as five-dimensional (5D) regularization, refers to the regularization of both the reflection wavefield and the surface wavefield in four spatial dimensions and time. In an implementation of the workflow, the four regularized spatial dimensions are common midpoint-x, common midpoint-y, crossline offset, and inline offset.

FIG. 1 is a schematic view of a seismic survey being performed to map subterranean features such as facies and faults in a subterranean formation 100. The subterranean formation 100 includes a layer of impermeable cap rocks 102 at the surface. Facies underlying the impermeable cap rocks 102 include a sandstone layer 104, a limestone layer 106, and a sand layer 108. A fault line 110 extends across the sandstone layer 104 and the limestone layer 106.

A seismic source 112 (for example, a seismic vibrator or an explosion) generates seismic waves 114 that propagate in the earth. The velocity of these seismic waves depends on properties such as, for example, density, porosity, and fluid content of the medium through which the seismic waves are traveling. Different geologic bodies or layers in the earth are distinguishable because the layers have different properties and, thus, different characteristic seismic velocities. For example, in the subterranean formation 100, the velocity of seismic waves traveling through the subterranean formation 100 will be different in the sandstone layer 104, the limestone layer 106, and the sand layer 108. As the seismic waves 114 contact interfaces between geologic bodies or layers that have different velocities, the interface reflects some of the energy of the seismic wave and refracts part of the energy of the seismic wave. Such interfaces are sometimes referred to as horizons.

The seismic waves 114 are received by a sensor or sensors 116. Although illustrated as a single component in FIG. 1, the sensor or sensors 116 are typically a line or an array of sensors 116 that generate an output signal in response to received seismic waves including waves reflected by the horizons in the subterranean formation 100. The sensors 116 can be geophone-receivers that produce electrical output signals transmitted as input data, for example, to a computer 118 on a seismic control truck 120. Based on the input data, the computer 118 may generate a seismic data output such as, for example, a seismic two-way response time plot.

A control center 122 can be operatively coupled to the seismic control truck 120 and other data acquisition and wellsite systems. The control center 122 may have computer facilities for receiving, storing, processing, and/or analyzing data from the seismic control truck 120 and other data acquisition and wellsite systems. For example, computer systems 124 in the control center 122 can be configured to analyze, model, control, optimize, or perform management tasks of field operations associated with development and production of resources such as oil and gas from the subterranean formation 100. Alternatively, the computer systems 124 can be located in a different location than the control center 122. Some computer systems are provided with functionality for manipulating and analyzing the data, such as performing seismic interpretation or borehole resistivity image log interpretation to identify geological surfaces in the subterranean formation or performing simulation, planning, and optimization of production operations of the wellsite systems.

FIG. 2 is a shot and receiver geometry 200 for a three-dimensional (3D) wide-azimuth seismic acquisition (WAZ) land survey, according to some implementations. As shown in FIG. 2, the shots and receivers are arranged orthogonally. FIG. 2 also shows the x axis and the y axis, which are the natural directions of seismic data acquisition. Each shot has a coordinate $(S_x, S_y)$ and each receiver has a coordinate $(R_x, R_y)$. Further, FIG. 2 shows the receiver inline direction and the receiver crossline direction. In this arrangement, crossline offset is equal to (shot y−receiver y) and inline offset is equal to (receiver x−shot x). Furthermore, Δ receiver x is the difference in x position between two adjacent receivers, Δ receiver y is the difference in y position between two adjacent receivers, Δ shot x is the difference in x position between two adjacent shots, and Δ shot y is the difference in y position between two adjacent shots. These variables are also shown in FIG. 2.

In an example, a WAZ survey is performed to map subterranean features. As explained previously, de-aliasing of the full wavefield is not possible using commercial methods. However, the disclosed seismic processing workflow can achieve de-aliasing of the full wavefield.

In a first stage of the seismic processing workflow, a first pass of a four-dimensional (4D) regularization technique is applied to seismic data that is recorded from a single receiver line (that is, a set of adjacent receiver x recordings). Alternatively, if the receiver line contains sharp discontinuities in receiver y, then the 4D regularization is applied to a portion of the receiver line that does not contain sharp discontinuities in receiver y. In some examples, normal moveout (NMO) corrections are applied to the seismic data prior to the first pass of 4D regularization.

The first pass of the 4D regularization technique involves regularizing three spatial dimensions: shot x, crossline offset, and inline offset. Then, to assign values to receiver y, the relationship between receiver y and receiver x is first extracted from the input data. Using this relationship, receiver y values are assigned to regularized output traces based on their value of receiver x, which is uniquely determined from the two regularized dimensions inline offset and shot x. By this construct, four spatial coordinates are defined, while restricting the computational load to only three spatial coordinates. Note that an implicit assumption that the function receiver y=f(receiver x) is relatively smooth must be honored. Accordingly, the input to the first 4D regularization pass (that is, the seismic data from a single receiver line) may be broken into piecewise continuous segments.

When applying the first pass of 4D regularization, an output spacing along the shot x dimension is set equal to an output spacing along the inline offset dimension. Furthermore, an output spacing along the crossline offset dimension is set equal to an output spacing along the inline offset dimension. Typically, the offset sampling is four times finer than the input sampling. Such sampling generates 16 times the input data at each shot x location output. However, such finely sampled data is only needed to represent cross-spread records at an un-aliased spacing, and is not necessary for further processing. Therefore, within each shot x location, the seismic data is decimated back to an inline and crossline offset interval corresponding to the field spacing of $\Delta$ receiver x and $\Delta$ shot y.

Before the seismic data is decimated back to the field spacing, an anti-alias filter is applied to the regularized data. In an implementation, the anti-alias filter is a 3D F-Kx-Ky anti-alias filter that incorporates the rejection of very strong slow velocity surface waves in order to remove surface waves from the seismic data. As this workflow is designed to separate and remove non P-wave (including surface waves) energy, the filter may be a velocity filter that filters velocities up to the lowest RMS P-wave velocity present. Typically, the minimal P-wave $V_{rms}$ is greater than 2000 m/s and the largest amplitude surface waves travel at a phase velocity much less than 2000 m/s.

In this first stage of the workflow, the dimensions of best sampling (that is, dimensions receiver x and shot y) are exploited in order to address the aliasing of the most problematic portions of the wavefield. Furthermore, by choosing the output spacing for the shot x dimension to be equal to the inline offset dimension, the orthogonal source traverse spacing is reduced to equal the group interval. Since inline offset=receiver x-shot x and shot x is directly regularized, receiver x is implicitly regularized when the inline offset is regularized. Group interval=$\Delta$ receiver x as acquired (more precisely, intended to be acquired) in the field. The first step also dramatically reduces the subsequent computational cost by typically reducing the input to the next stage by a factor of 16. The F-Kx-Ky filter also reduces the spatial complexity of the input, which helps a second 4D regularization pass in the second stage of the workflow converge upon a more plausible result.

In the second stage of the seismic processing workflow, the input is restricted to the subsets of the output of the first stage that have a common value of shot x. Then, a second pass of the 4D regularization technique is applied to the subsets. In particular, the second pass of the 4D regularization technique regularizes the subsets along three spatial dimensions: receiver y, crossline offset, and inline offset. Here, the output receiver y spacing is set equal to the input receiver x spacing. Doing so achieves symmetric sampling of shots and receivers at a uniform spacing, d, equal to the smallest acquisition dimension, which is receiver x. Further, the crossline offset spacing and the inline offset spacing remains unchanged from the output of the first step.

The regularized data is then sorted into common midpoint (CMP) gathers using a CMP bin spacing of: $\Delta$rec x/2 by $\Delta$shot y/2. However, these CMP gathers possess symmetric but still aliased sampling along the crossline offset and the inline offset dimensions. In particular, the spacing along these two dimensions is twice the uniform spacing d. A three-dimensional (3D) regularization algorithm is then applied to the CMP gathers. In particular, the 3D regularization algorithm regularizes data along the dimensions: inline offset=receiver x-shot x, crossline offset=receiver y-shot y. The output spacing is equal to the field spacing of $\Delta$ receiver x and $\Delta$ shot y. As a result, the CMP gathers are now regularized at a spacing of no larger than d.

Once the CMP gathers are regularized, a second F-$K_x$-$K_y$ anti-alias dip reject filter is applied to the CMP gathers. For NMO corrected gathers in the CMP domain, there is far better kinematic separation of high velocity refracted waves and converted waves from P-wave components than is afforded by other domains such as the shot receiver cross-spread or common offset domains. Therefore, given that the data is in the CMP domain, an aggressive F-Kx-Ky filter can be applied with minimal risk to the signal, to reject high apparent velocities. This filter has a dramatic impact on the pre-stack signal to noise ratio. Furthermore, the filter is selected to be appropriate to the desired output decimation.

Once the second anti-alias dip reject filter is applied to the CMP gathers, the output is decimated to create full waveform de-aliased gathers. In an implementation, the output decimation sampling is a symmetric sampling, s, that is a function of available storage capacity. In an example, the symmetric sampling, s, of inline and crossline offset is selected as the lesser of twice the input sampling dimensions: $\Delta$ receiver y and $\Delta$ shot x. The choice of decimation directly influences subsequent processing cost, as well signal resolution will not exceed that of the field acquisition.

Trial and error has shown that symmetric sampling of the wavefield in all four spatial dimensions is beneficial. This is achieved through the workflow by setting the output spacing equal to the smallest spatial sample interval acquired in the field. Typically, this is the receiver x spacing.

The two-pass application of this process lends itself to parallel computation. This is because the result for one receiver line in the first step is independent of the result of any other receiver line, allowing concurrent run streams. This coarse level parallelism also applies to common shot x subsets in the second step. By means of this seismic processing workflow, both the computational and geophysical complexity of de-aliasing the full wavefield are rendered feasible and robust, with credible results achieved on surveys with receiver y spacings as large as 12 times receiver x spacings.

In an embodiment, after the seismic processing workflow is completed, a model of the noise can be constructed and adaptively subtracted from the original data so that the estimated surface consistent operators can be estimated from data with significantly higher signal to noise. The whole process is then iterated by application of these surface consistent operators to the input to the FWD process.

FIG. 3 is a flowchart illustrating an example method 300 for a seismic processing workflow, according to some implementations. For clarity of presentation, the description that follows generally describes method 300 in the context of the other figures in this description. For example, method 300 can be performed by a computer system 800 described in FIG. 8. However, it will be understood that method 300 may be performed, for example, by any suitable system, environment, software, and hardware, or a combination of systems, environments, software, and hardware, as appropriate. In some implementations, various steps of method 300 can be run in parallel, in combination, in loops, or in any order.

The method 300 starts at step 310, which involves applying a first pass of a 4-dimensional (4D) regularization technique to a first plurality of subsets of a seismic survey to generate finely sampled regularized seismic data. The first plurality of subsets includes piecewise continuous sets of seismic data recorded by a single receiver line. Furthermore, an output spacing of the first pass along a crossline offset dimension is set equal to both an output spacing of the first pass along an offset inline dimension and an output spacing of the first pass along a shot x dimension.

At step 312, the method 300 involves applying a first F-Kx-Ky anti-alias dip reject filter to the finely sampled regularized seismic data.

At step 314, the method involves decimating an output of the first F-Kx-Ky dip reject anti-alias filter back to an equivalent field spacing of Δ receiver x and Δ shot y, thereby maintaining a new regular spacing in crossline offset, inline offset, and receiver x, wherein Δ crossline offset=Δinline offset=Δshot x=field Δ receiver x.

At step 316, the method 300 involves sorting the decimated seismic data into a second plurality of subsets that share a common value of shot x.

At step 318, the method 300 involves applying a second pass of the 4D regularization technique to the second plurality of subsets, thereby achieving regularization of the fourth spatial coordinate receiver y. In this step, sampling along inline offset and xline offset dimensions are unchanged but sampling along a receiver y dimension is set equal to the sampling along the crossline offset dimension.

At step 320, the method 300 involves sorting the second plurality of subsets of the 4D regularization technique into a plurality of common midpoint (CMP) gathers.

At step 322, the method 300 involves applying, within a CMP gather, a 3-dimensional (3D) regularization technique to further reduce the previously regularized sampling of Δ crossline offset and Δ inline offset. In this step, an output spacing along each regularized dimension is set equal to the field spacing Δ receiver x.

At step 324, the method 300 involve applying a second F-Kx-Ky dip reject anti-alias filter to the regularized CMP gathers.

At step 326, the method 300 involves decimating an output of the second F-Kx-Ky filter back to an inline and crossline offset sampling equal to twice a minimum of the field spacings Δ shot x and Δ receiver y to create full waveform de-aliased gathers. In an implementation, the anti-alias filter in step 324 reflects this choice of decimated sampling.

The example method 300 shown in FIG. 3 can be modified or reconfigured to include additional, fewer, or different steps (not shown in FIG. 3), which can be performed in the order shown or in a different order. As an example, after step 326, the method 300 may involve constructing a model of noise in the seismic data and adaptively subtracting the noise from the seismic data.

In some implementations, one or more of the steps shown in FIG. 3 can be repeated or reiterated, for example, until a terminating condition is reached. In some implementations, one or more of the individual steps shown in FIG. 3 can be executed as multiple separate steps, or one or more subsets of the steps shown in FIG. 3 can be combined and executed as a single step. In some implementations, one or more of the individual steps shown in FIG. 3 may also be omitted from the example method 300.

Figure 4A:
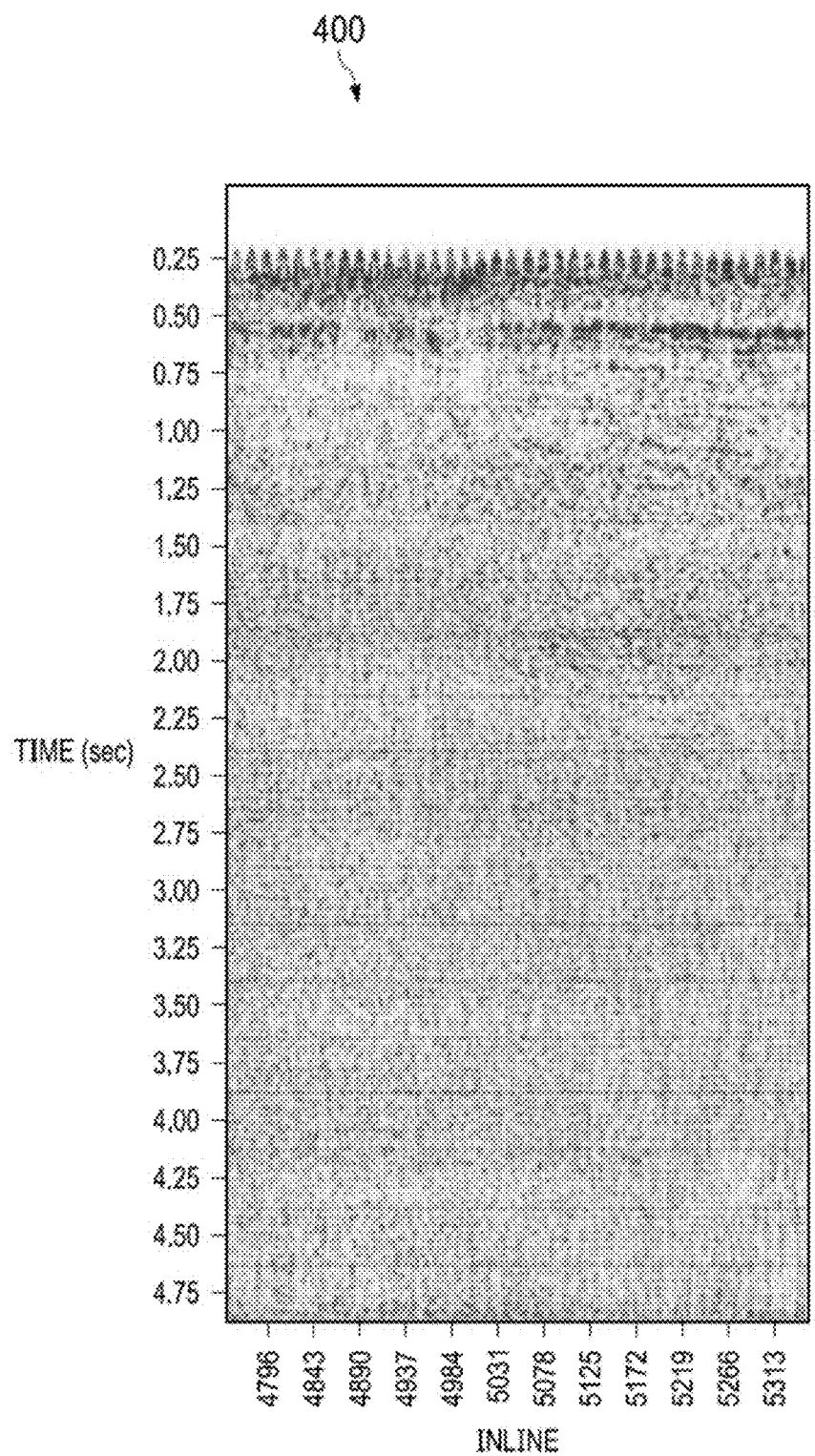
FIGS. 4A, 4B, and 4C illustrate a progressive effect upon the stack image of the first two passes of four-dimensional (4D) regularization, where the displayed section is along an inline dimension, according to some implementations of the present disclosure.
Figure 4B:
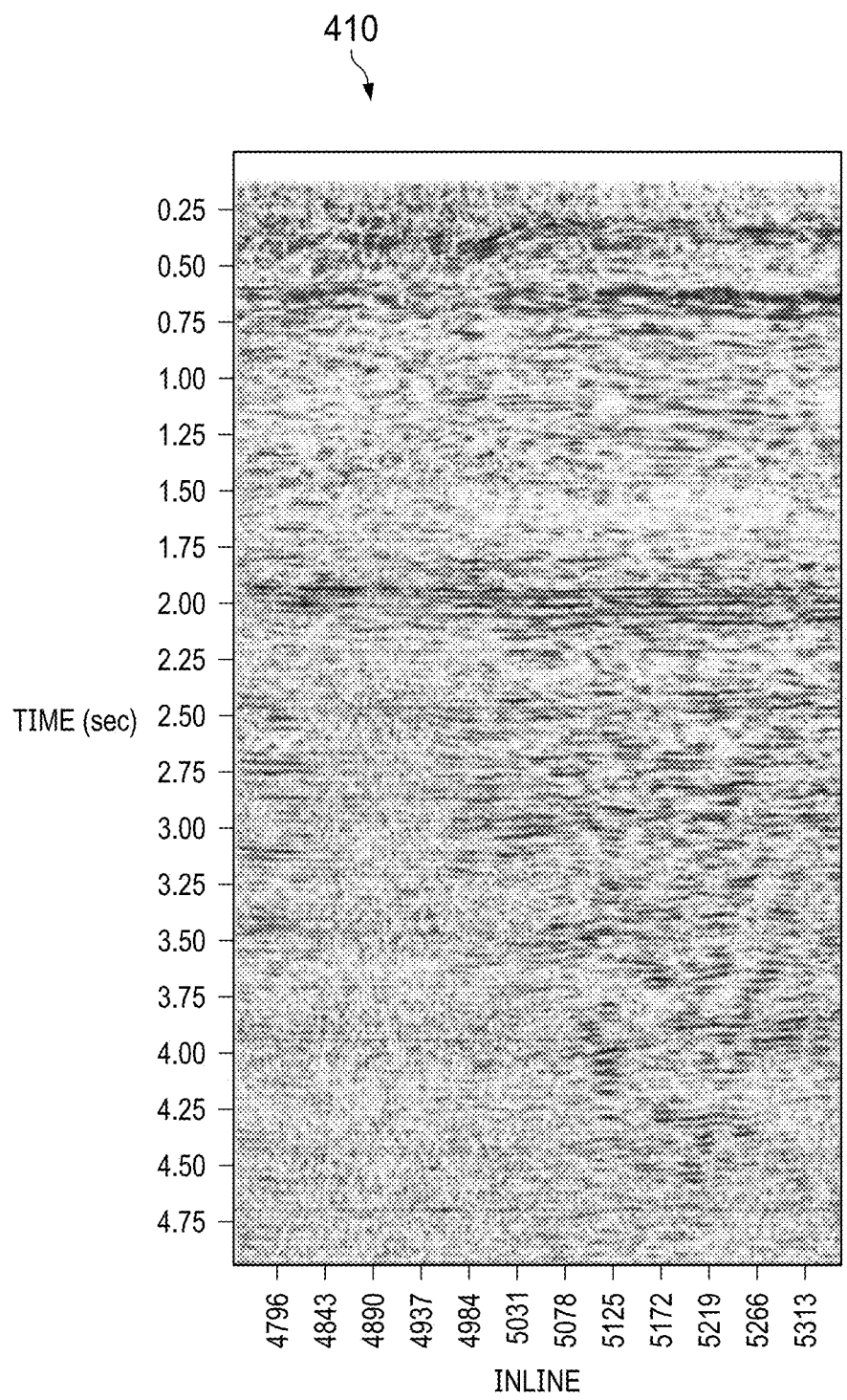
Figure 4C:
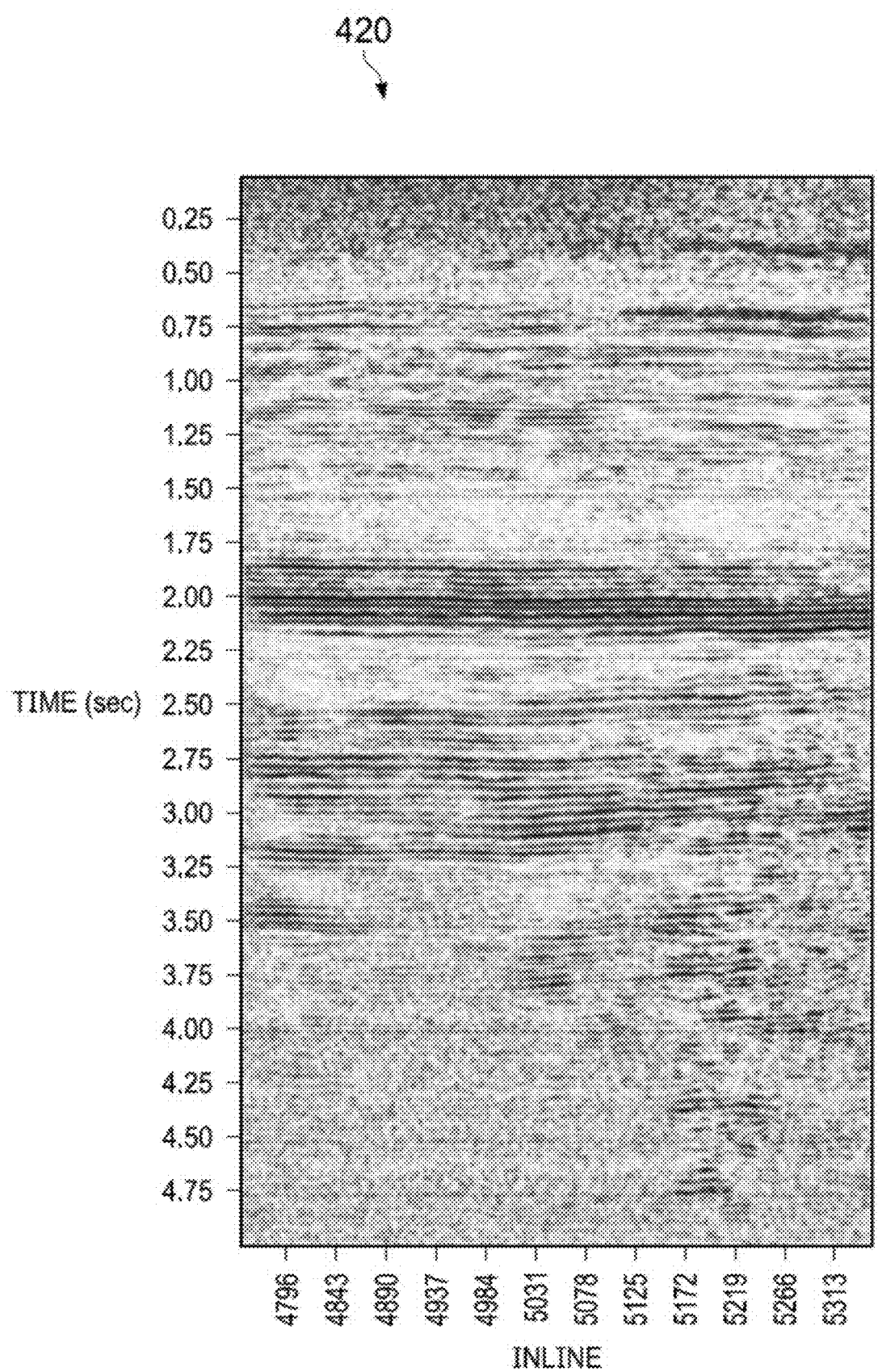

FIGS. 4A, 4B, and 4C illustrate stack images along an inline direction before and after the two passes of 4D regularization of seismic data, according to some implementations. In particular, image 400 is a stack image of an input to the disclosed methodology, image 410 is a stack image after the first 4D regularization of the input seismic data, and image 420 is a stack image after the second 4D regularization of the seismic data.

Figure 5A:
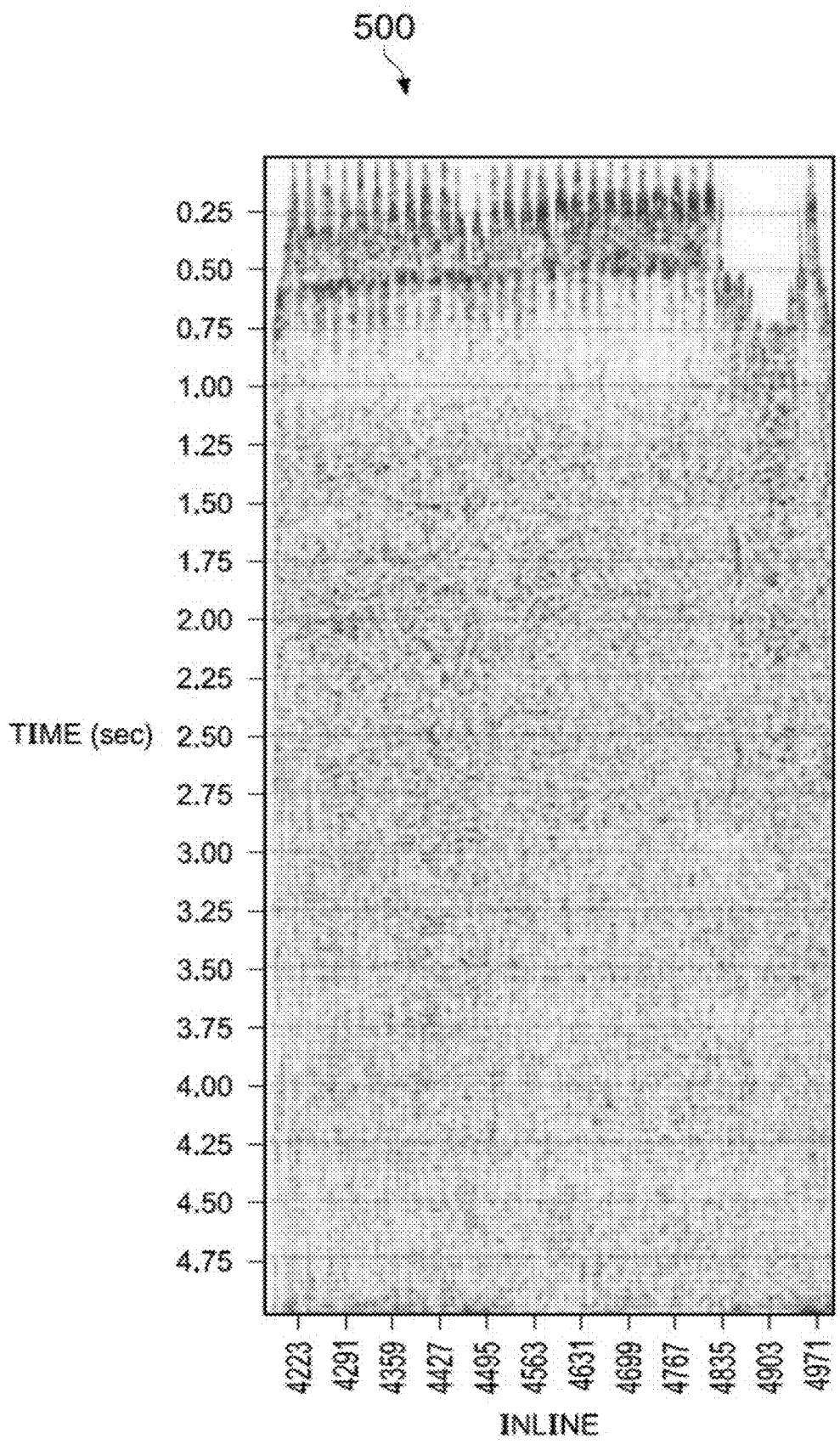
FIGS. 5A, 5B, and 5C illustrate a progressive effect upon the stack image of the first two passes of 4D regularization, where the displayed section is along a crossline dimension, according to some implementations of the present disclosure.
Figure 5B:
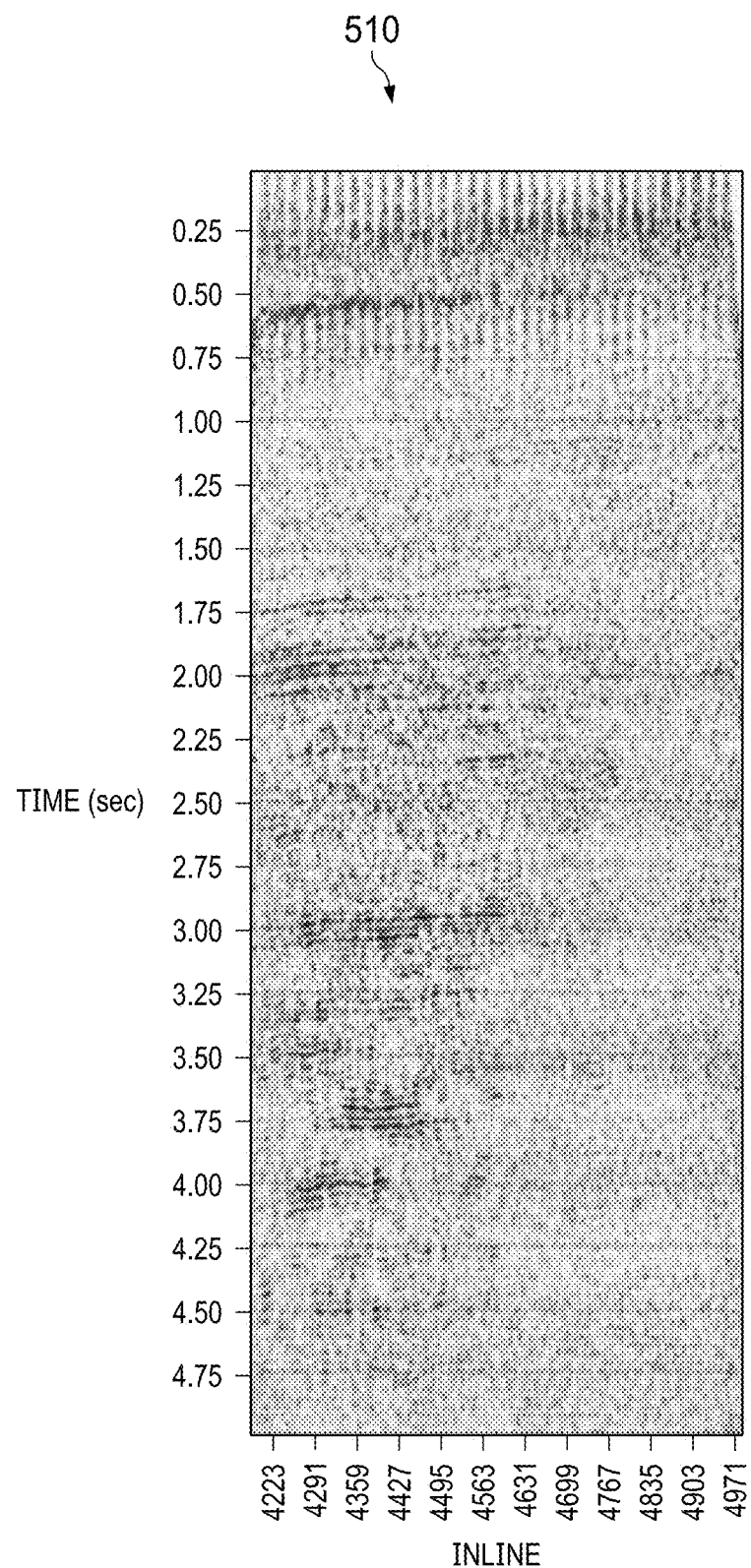
Figure 5C:
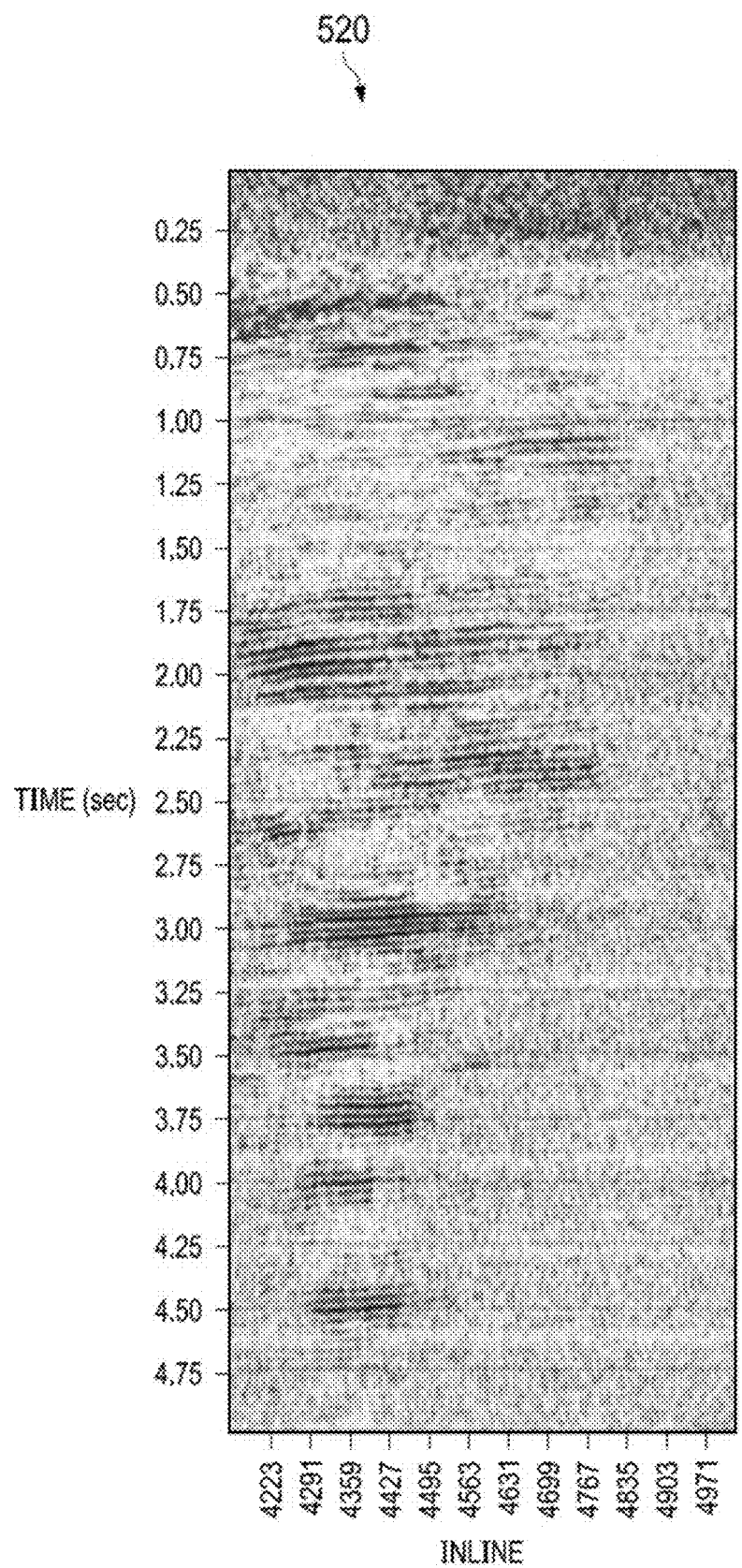

FIGS. 5A, 5B, and 5C illustrate stack images along a crossline direction before and after the two passes of 4D regularization of seismic data, according to some implementations. In particular, image 500 is a stack image of the input to the disclosed methodology, image 510 is a stack image after the first 4D regularization of the input seismic data, and image 520 is a stack image after the second 4D regularization of the seismic data.

Figure 6A:
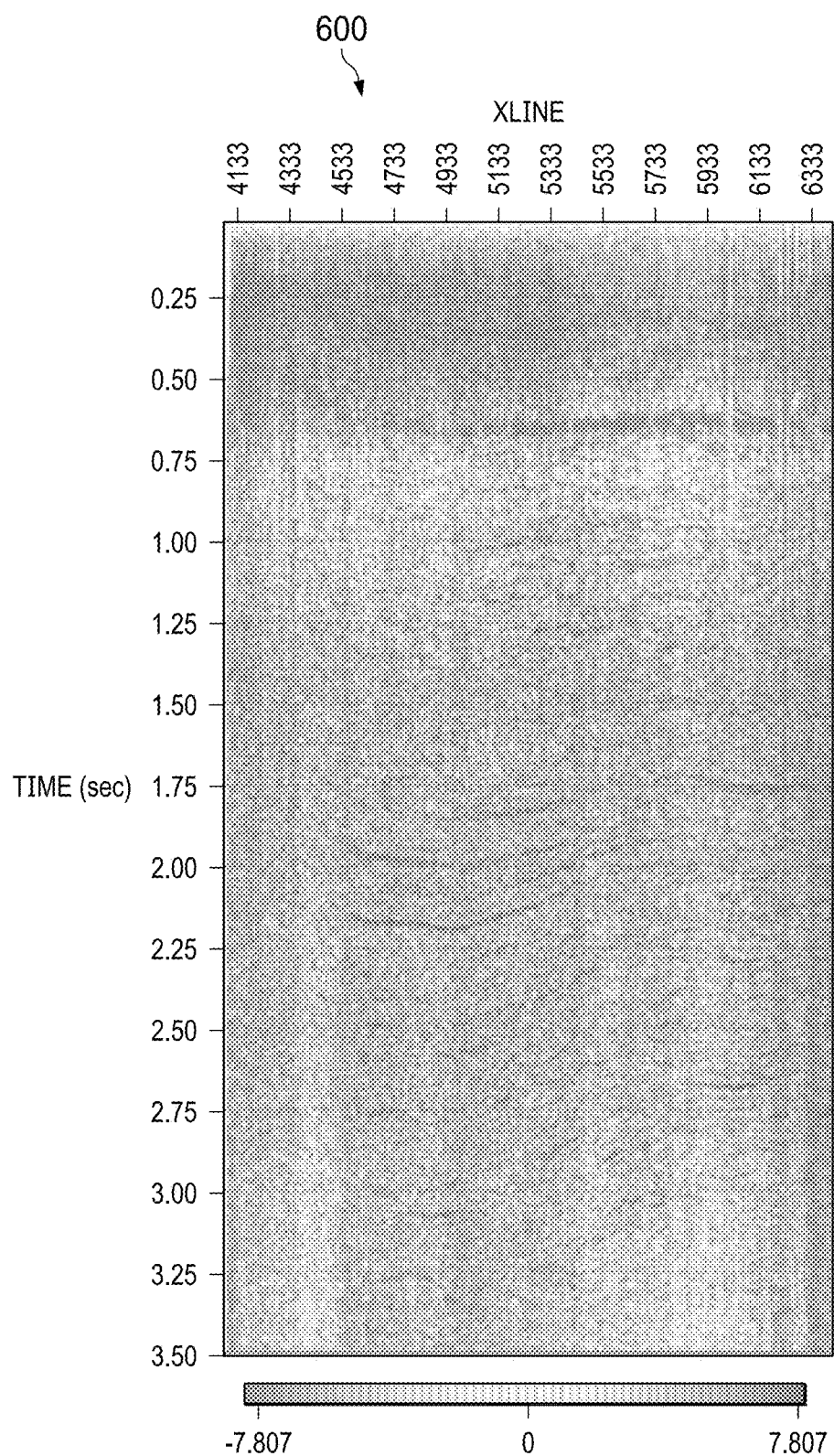
FIGS. 6A and 6B illustrate an image of the stack of the input and output of the seismic processing workflow of FIG. 3, according to some implementations of the present disclosure.
Figure 6B:
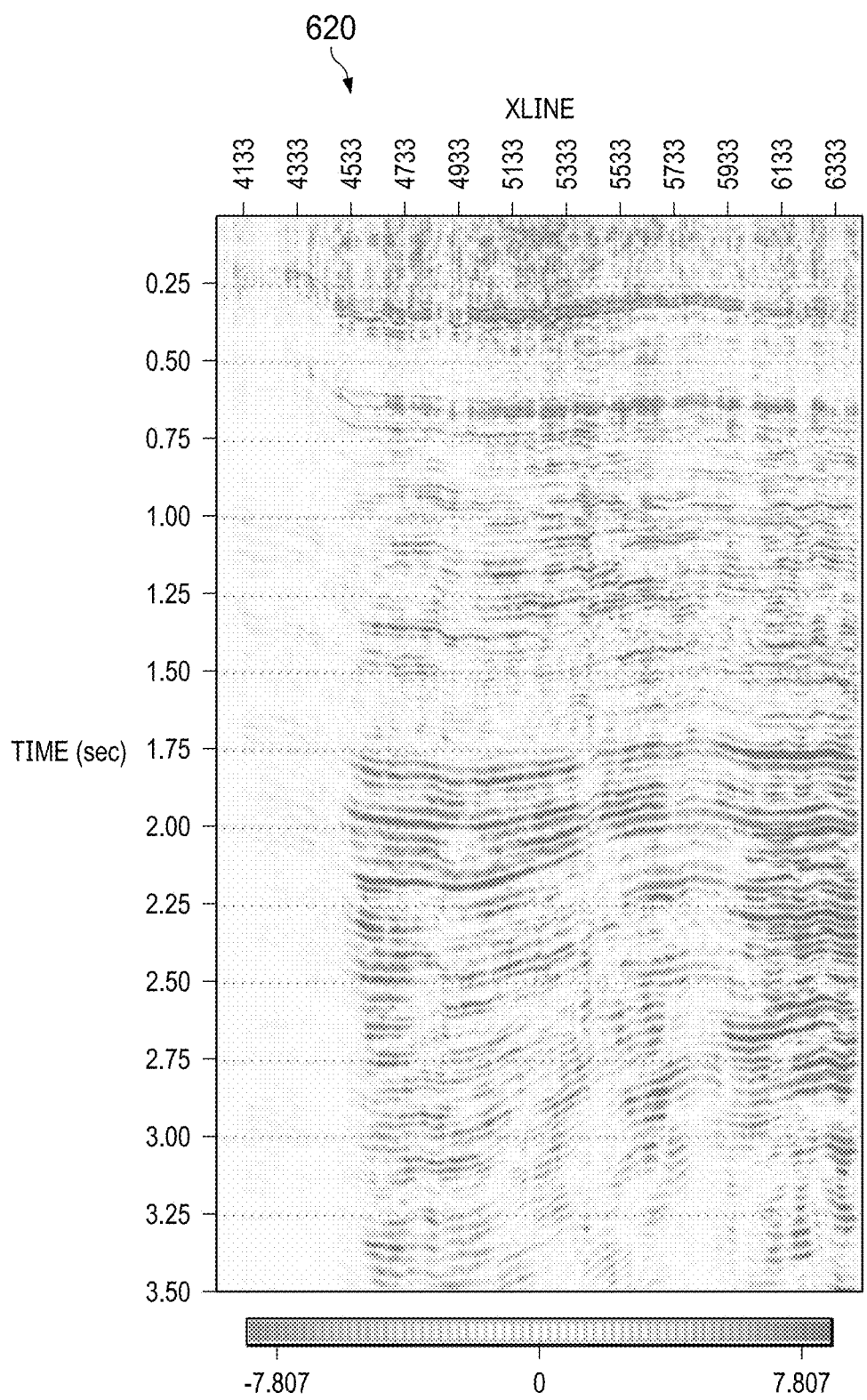

FIGS. 6A and 6B illustrate stacked images of seismic data processed according to the disclosed methodology, according to some implementations. In particular, image 600 is a stacked image of input seismic data in an inline direction. Image 620 is an image of the output of the disclosed seismic processing workflow with additional decimation such that only traces nearest to the input were used to create the stacked image.

Figure 7A:
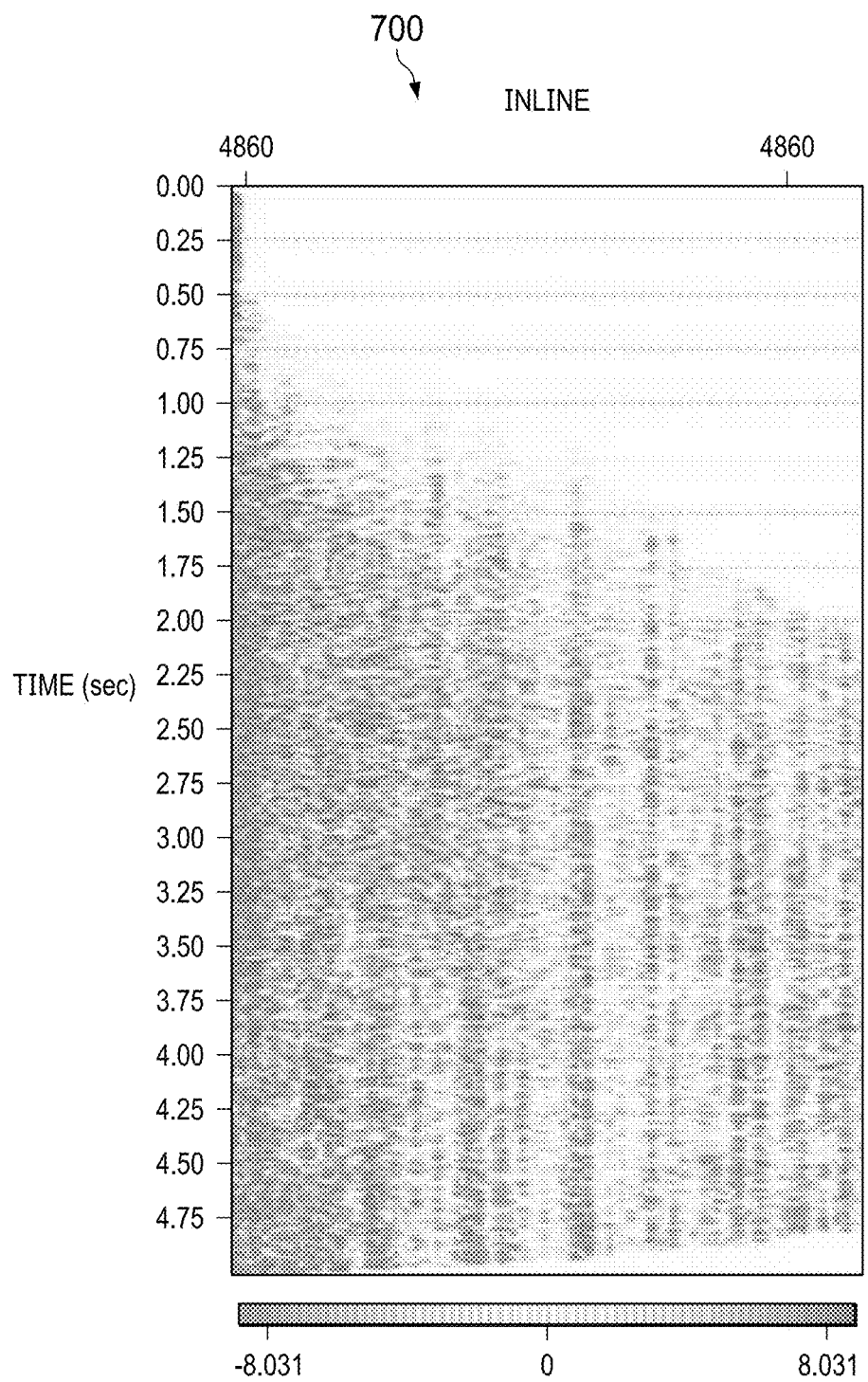
FIG. 7A and FIG. 7B illustrate the effect upon prestack CMP gathers of the seismic processing workflow of FIG. 3, according to some implementations of the present disclosure.
Figure 7B:
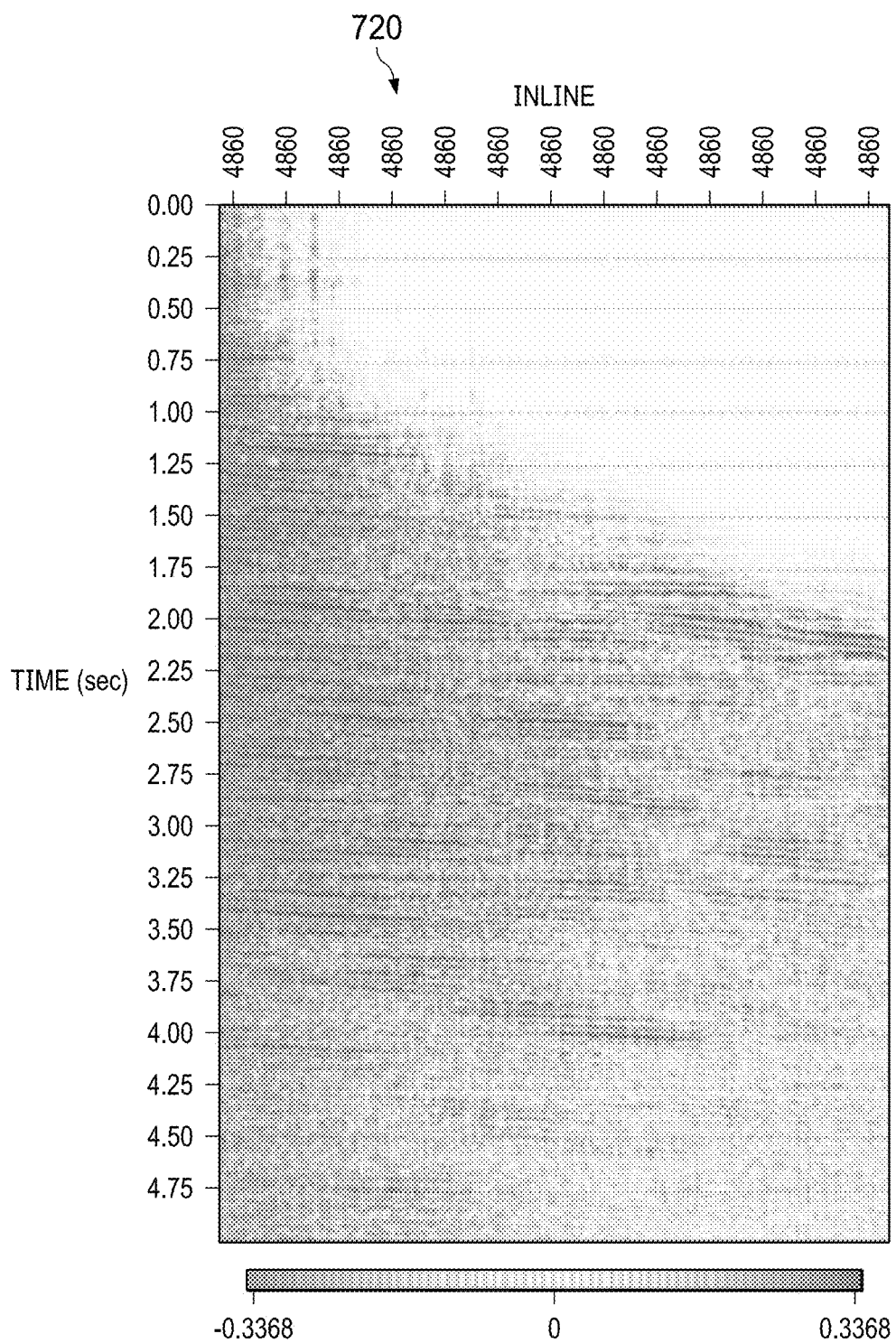

FIG. 7A and FIG. 7B illustrate seismic data processed according to the disclosed methodology, according to some implementations. In particular, image 700 is an image of an input CMP gather and image 720 is an image of the corresponding output CMP gather of the disclosed seismic processing workflow.

Figure 8:
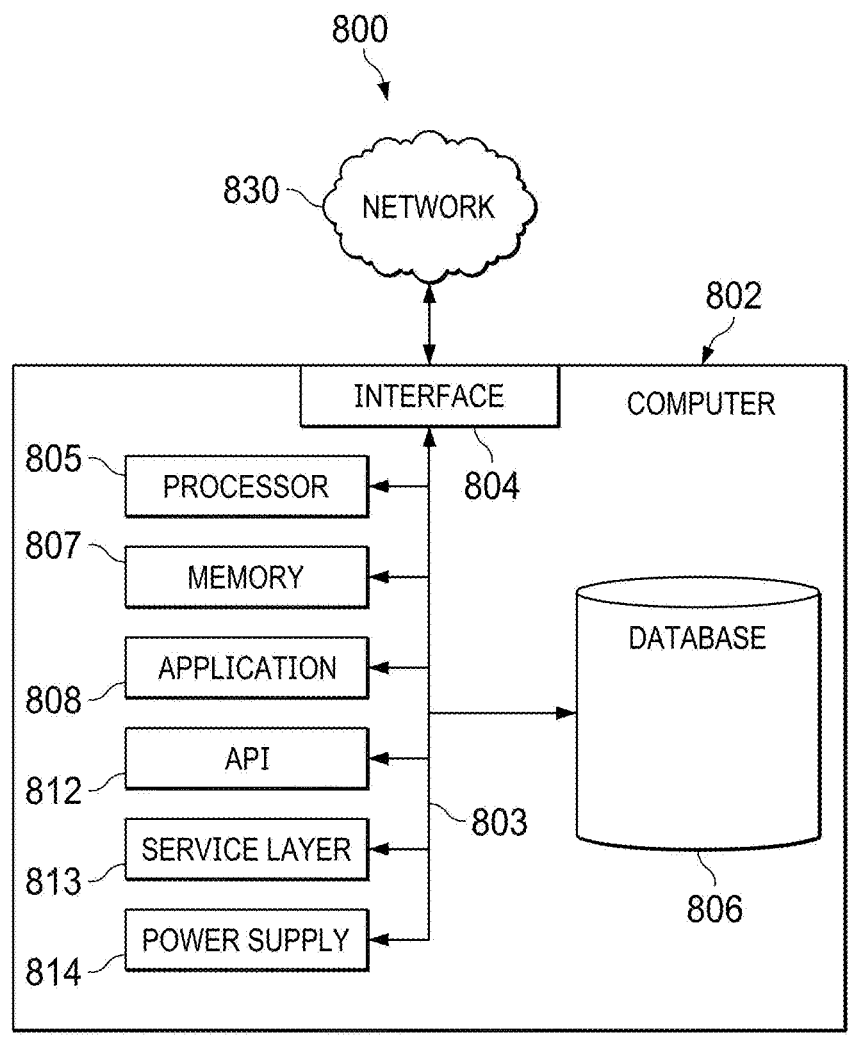
FIG. 8 is a block diagram showing an example computer system used to provide computational functionalities associated with described algorithms, methods, functions, processes, flows, and procedures as described in the instant disclosure, according to some implementations.

FIG. 8 is a block diagram of an example computer system 800 used to provide computational functionalities associated with described algorithms, methods, functions, processes, flows, and procedures described in the present disclosure, according to some implementations of the present disclosure. The illustrated computer 802 is intended to encompass any computing device such as a server, a desktop computer, a laptop/notebook computer, a wireless data port, a smart phone, a personal data assistant (PDA), a tablet computing device, or one or more processors within these devices, including physical instances, virtual instances, or both. The computer 802 can include input devices such as keypads, keyboards, and touch screens that can accept user information. Also, the computer 802 can include output devices that can convey information associated with the operation of the computer 802. The information can include digital data, visual data, audio information, or a combination of information. The information can be presented in a graphical user interface (UI) (or GUI).

The computer 802 can serve in a role as a client, a network component, a server, a database, a persistency, or components of a computer system for performing the subject matter described in the present disclosure. The illustrated computer 802 is communicably coupled with a network 830. In some implementations, one or more components of the computer 802 can be configured to operate within different environments, including cloud-computing-based environments, local environments, global environments, and combinations of environments.

At a high level, the computer 802 is an electronic computing device operable to receive, transmit, process, store, and manage data and information associated with the described subject matter. According to some implementations, the computer 802 can also include, or be communicably coupled with, an application server, an email server, a web server, a caching server, a streaming data server, or a combination of servers.

The computer 802 can receive requests over network 830 from a client application (for example, executing on another computer 802). The computer 802 can respond to the received requests by processing the received requests using software applications. Requests can also be sent to the computer 802 from internal users (for example, from a command console), external (or third) parties, automated applications, entities, individuals, systems, and computers.

Each of the components of the computer 802 can communicate using a system bus 803. In some implementations, any or all of the components of the computer 802, including hardware or software components, can interface with each other or the interface 804 (or a combination of both), over the system bus 803. Interfaces can use an application programming interface (API) 812, a service layer 813, or a combination of the API 812 and service layer 813. The API 812 can include specifications for routines, data structures, and object classes. The API 812 can be either computer-language independent or dependent. The API 812 can refer to a complete interface, a single function, or a set of APIs.

The service layer 813 can provide software services to the computer 802 and other components (whether illustrated or not) that are communicably coupled to the computer 802. The functionality of the computer 802 can be accessible for all service consumers using this service layer. Software services, such as those provided by the service layer 813, can provide reusable, defined functionalities through a defined interface. For example, the interface can be software written in JAVA, C++, or a language providing data in extensible markup language (XML) format. While illustrated as an integrated component of the computer 802, in alternative implementations, the API 812 or the service layer 813 can be stand-alone components in relation to other components of the computer 802 and other components communicably coupled to the computer 802. Moreover, any or all parts of the API 812 or the service layer 813 can be implemented as child or sub-modules of another software module, enterprise application, or hardware module without departing from the scope of the present disclosure.

The computer 802 includes an interface 804. Although illustrated as a single interface 804 in FIG. 8, two or more interfaces 804 can be used according to particular needs, desires, or particular implementations of the computer 802 and the described functionality. The interface 804 can be used by the computer 802 for communicating with other systems that are connected to the network 830 (whether illustrated or not) in a distributed environment. Generally, the interface 804 can include, or be implemented using, logic encoded in software or hardware (or a combination of software and hardware) operable to communicate with the network 830. More specifically, the interface 804 can include software supporting one or more communication protocols associated with communications. As such, the network 830 or the interface's hardware can be operable to communicate physical signals within and outside of the illustrated computer 802.

The computer 802 includes a processor 805. Although illustrated as a single processor 805 in FIG. 8, two or more processors 805 can be used according to particular needs, desires, or particular implementations of the computer 802 and the described functionality. Generally, the processor 805 can execute instructions and can manipulate data to perform the operations of the computer 802, including operations using algorithms, methods, functions, processes, flows, and procedures as described in the present disclosure.

The computer 802 also includes a database 806 that can hold data for the computer 802 and other components connected to the network 830 (whether illustrated or not). For example, database 806 can be an in-memory, conventional, or a database storing data consistent with the present disclosure. In some implementations, database 806 can be a combination of two or more different database types (for example, hybrid in-memory and conventional databases) according to particular needs, desires, or particular implementations of the computer 802 and the described functionality. Although illustrated as a single database 806 in FIG. 8, two or more databases (of the same, different, or combination of types) can be used according to particular needs, desires, or particular implementations of the computer 802 and the described functionality. While database 806 is illustrated as an internal component of the computer 802, in alternative implementations, database 806 can be external to the computer 802.

The computer 802 also includes a memory 807 that can hold data for the computer 802 or a combination of components connected to the network 830 (whether illustrated or not). Memory 807 can store any data consistent with the present disclosure. In some implementations, memory 807 can be a combination of two or more different types of memory (for example, a combination of semiconductor and magnetic storage) according to particular needs, desires, or particular implementations of the computer 802 and the described functionality. Although illustrated as a single memory 807 in FIG. 8, two or more memories 807 (of the same, different, or combination of types) can be used according to particular needs, desires, or particular implementations of the computer 802 and the described functionality. While memory 807 is illustrated as an internal component of the computer 802, in alternative implementations, memory 807 can be external to the computer 802.

The application 808 can be an algorithmic software engine providing functionality according to particular needs, desires, or particular implementations of the computer 802 and the described functionality. For example, application 808 can serve as one or more components, modules, or applications. Further, although illustrated as a single application 808, the application 808 can be implemented as multiple applications 808 on the computer 802. In addition, although illustrated as internal to the computer 802, in alternative implementations, the application 808 can be external to the computer 802.

The computer 802 can also include a power supply 814. The power supply 814 can include a rechargeable or non-rechargeable battery that can be configured to be either user- or non-user-replaceable. In some implementations, the power supply 814 can include power-conversion and management circuits, including recharging, standby, and power management functionalities. In some implementations, the power-supply 814 can include a power plug to allow the computer 802 to be plugged into a wall socket or a power source to, for example, power the computer 802 or recharge a rechargeable battery.

There can be any number of computers 802 associated with, or external to, a computer system containing computer 802, with each computer 802 communicating over network 830. Further, the terms "client," "user," and other appropriate terminology can be used interchangeably, as appropriate, without departing from the scope of the present disclosure. Moreover, the present disclosure contemplates that many users can use one computer 802 and one user can use multiple computers 802.

Implementations of the subject matter and the functional operations described in this specification can be implemented in digital electronic circuitry, in tangibly embodied computer software or firmware, in computer hardware, including the structures disclosed in this specification and their structural equivalents, or in combinations of one or more of them. Software implementations of the described subject matter can be implemented as one or more computer programs. Each computer program can include one or more modules of computer program instructions encoded on a tangible, non-transitory, computer-readable computer-storage medium for execution by, or to control the operation of, data processing apparatus. Alternatively, or additionally, the program instructions can be encoded in/on an artificially generated propagated signal. The example, the signal can be a machine-generated electrical, optical, or electromagnetic signal that is generated to encode information for transmission to suitable receiver apparatus for execution by a data processing apparatus. The computer-storage medium can be a machine-readable storage device, a machine-readable storage substrate, a random or serial access memory device, or a combination of computer-storage mediums.

The terms "data processing apparatus," "computer," and "electronic computer device" (or equivalent as understood by one of ordinary skill in the art) refer to data processing hardware. For example, a data processing apparatus can encompass all kinds of apparatus, devices, and machines for processing data, including by way of example, a programmable processor, a computer, or multiple processors or computers. The apparatus can also include special purpose logic circuitry including, for example, a central processing unit (CPU), a field programmable gate array (FPGA), or an application specific integrated circuit (ASIC). In some implementations, the data processing apparatus or special purpose logic circuitry (or a combination of the data processing apparatus or special purpose logic circuitry) can be hardware- or software-based (or a combination of both hardware- and software-based). The apparatus can optionally include code that creates an execution environment for computer programs, for example, code that constitutes processor firmware, a protocol stack, a database management system, an operating system, or a combination of execution environments. The present disclosure contemplates the use of data processing apparatuses with or without conventional operating systems, for example LINUX, UNIX, WINDOWS, MAC OS, ANDROID, or IOS.

A computer program, which can also be referred to or described as a program, software, a software application, a module, a software module, a script, or code, can be written in any form of programming language. Programming languages can include, for example, compiled languages, interpreted languages, declarative languages, or procedural languages. Programs can be deployed in any form, including as stand-alone programs, modules, components, subroutines, or units for use in a computing environment. A computer program can, but need not, correspond to a file in a file system. A program can be stored in a portion of a file that holds other programs or data, for example, one or more scripts stored in a markup language document, in a single file dedicated to the program in question, or in multiple coordinated files storing one or more modules, sub programs, or portions of code. A computer program can be deployed for execution on one computer or on multiple computers that are located, for example, at one site or distributed across multiple sites that are interconnected by a communication network. While portions of the programs illustrated in the various figures may be shown as individual modules that implement the various features and functionality through various objects, methods, or processes, the programs can instead include a number of sub-modules, third-party services, components, and libraries. Conversely, the features and functionality of various components can be combined into single components as appropriate. Thresholds used to make computational determinations can be statically, dynamically, or both statically and dynamically determined.

The methods, processes, or logic flows described in this specification can be performed by one or more programmable computers executing one or more computer programs to perform functions by operating on input data and generating output. The methods, processes, or logic flows can also be performed by, and apparatus can also be implemented as, special purpose logic circuitry, for example, a CPU, an FPGA, or an ASIC.

Computers suitable for the execution of a computer program can be based on one or more of general and special purpose microprocessors and other kinds of CPUs. The elements of a computer are a CPU for performing or executing instructions and one or more memory devices for storing instructions and data. Generally, a CPU can receive instructions and data from (and write data to) a memory. A computer can also include, or be operatively coupled to, one or more mass storage devices for storing data. In some implementations, a computer can receive data from, and transfer data to, the mass storage devices including, for example, magnetic, magneto optical disks, or optical disks. Moreover, a computer can be embedded in another device, for example, a mobile telephone, a personal digital assistant (PDA), a mobile audio or video player, a game console, a global positioning system (GPS) receiver, or a portable storage device such as a universal serial bus (USB) flash drive.

Computer readable media (transitory or non-transitory, as appropriate) suitable for storing computer program instructions and data can include all forms of permanent/non-permanent and volatile/non-volatile memory, media, and memory devices. Computer readable media can include, for example, semiconductor memory devices such as random access memory (RAM), read only memory (ROM), phase change memory (PRAM), static random access memory (SRAM), dynamic random access memory (DRAM), erasable programmable read-only memory (EPROM), electrically erasable programmable read-only memory (EEPROM), and flash memory devices. Computer readable media can also include, for example, magnetic devices such as tape, cartridges, cassettes, and internal/removable disks. Computer readable media can also include magneto optical disks and optical memory devices and technologies including, for example, digital video disc (DVD), CD ROM, DVD+/−R, DVD-RAM, DVD-ROM, HD-DVD, and BLU-RAY. The memory can store various objects or data, including caches, classes, frameworks, applications, modules, backup data, jobs, web pages, web page templates, data structures, database tables, repositories, and dynamic information. Types of objects and data stored in memory can include parameters, variables, algorithms, instructions, rules, constraints, and references. Additionally, the memory can include logs, policies, security or access data, and reporting files. The processor and the memory can be supplemented by, or incorporated in, special purpose logic circuitry.

Implementations of the subject matter described in the present disclosure can be implemented on a computer having a display device for providing interaction with a user, including displaying information to (and receiving input from) the user. Types of display devices can include, for example, a cathode ray tube (CRT), a liquid crystal display (LCD), a light-emitting diode (LED), and a plasma monitor. Display devices can include a keyboard and pointing devices including, for example, a mouse, a trackball, or a trackpad. User input can also be provided to the computer through the use of a touchscreen, such as a tablet computer surface with pressure sensitivity or a multi-touch screen using capacitive or electric sensing. Other kinds of devices can be used to provide for interaction with a user, including to receive user feedback including, for example, sensory feedback including visual feedback, auditory feedback, or tactile feedback. Input from the user can be received in the form of acoustic, speech, or tactile input. In addition, a computer can interact with a user by sending documents to, and receiving documents from, a device that is used by the user. For example, the computer can send web pages to a web browser on a user's client device in response to requests received from the web browser.

The term "graphical user interface," or "GUI," can be used in the singular or the plural to describe one or more graphical user interfaces and each of the displays of a particular graphical user interface. Therefore, a GUI can represent any graphical user interface, including, but not limited to, a web browser, a touch screen, or a command line interface (CLI) that processes information and efficiently presents the information results to the user. In general, a GUI can include a plurality of user interface (UI) elements, some or all associated with a web browser, such as interactive fields, pull-down lists, and buttons. These and other UI elements can be related to or represent the functions of the web browser.

Implementations of the subject matter described in this specification can be implemented in a computing system that includes a back end component, for example, as a data server, or that includes a middleware component, for example, an application server. Moreover, the computing system can include a front-end component, for example, a client computer having one or both of a graphical user interface or a Web browser through which a user can interact with the computer. The components of the system can be interconnected by any form or medium of wireline or wireless digital data communication (or a combination of data communication) in a communication network. Examples of communication networks include a local area network (LAN), a radio access network (RAN), a metropolitan area network (MAN), a wide area network (WAN), Worldwide Interoperability for Microwave Access (WIMAX), a wireless local area network (WLAN) (for example, using 802.11 a/b/g/n or 802.20 or a combination of protocols), all or a portion of the Internet, or any other communication system or systems at one or more locations (or a combination of communication networks). The network can communicate with, for example, Internet Protocol (IP) packets, frame relay frames, asynchronous transfer mode (ATM) cells, voice, video, data, or a combination of communication types between network addresses.

The computing system can include clients and servers. A client and server can generally be remote from each other and can typically interact through a communication network. The relationship of client and server can arise by virtue of computer programs running on the respective computers and having a client-server relationship.

Cluster file systems can be any file system type accessible from multiple servers for read and update. Locking or consistency tracking may not be necessary since the locking of exchange file system can be done at application layer. Furthermore, Unicode data files can be different from non-Unicode data files.

While this specification contains many specific implementation details, these should not be construed as limitations on the scope of what may be claimed, but rather as descriptions of features that may be specific to particular implementations. Certain features that are described in this specification in the context of separate implementations can also be implemented, in combination, in a single implementation. Conversely, various features that are described in the context of a single implementation can also be implemented in multiple implementations, separately, or in any suitable sub-combination. Moreover, although previously described features may be described as acting in certain combinations and even initially claimed as such, one or more features from a claimed combination can, in some cases, be excised from the combination, and the claimed combination may be directed to a sub-combination or variation of a sub-combination.

Particular implementations of the subject matter have been described. Other implementations, alterations, and permutations of the described implementations are within the scope of the following claims as will be apparent to those skilled in the art. While operations are depicted in the drawings or claims in a particular order, this should not be understood as requiring that such operations be performed in the particular order shown or in sequential order, or that all illustrated operations be performed (some operations may be considered optional), to achieve desirable results. In certain circumstances, multitasking or parallel processing (or a combination of multitasking and parallel processing) may be advantageous and performed as deemed appropriate.

Moreover, the separation or integration of various system modules and components in the previously described implementations should not be understood as requiring such separation or integration in all implementations, and it should be understood that the described program components and systems can generally be integrated together in a single software product or packaged into multiple software products.

Accordingly, the previously described example implementations do not define or constrain the present disclosure. Other changes, substitutions, and alterations are also possible without departing from the spirit and scope of the present disclosure.

Furthermore, any claimed implementation is considered to be applicable to at least a computer-implemented method; a non-transitory, computer-readable medium storing computer-readable instructions to perform the computer-implemented method; and a computer system comprising a computer memory interoperably coupled with a hardware processor configured to perform the computer-implemented method or the instructions stored on the non-transitory, computer-readable medium.

We claim:

1. A method for processing seismic data generated using an orthogonal arrangement of shots and receivers, wherein each shot location is described using coordinates (shot x, shot y) and each receiver location is described using coordinates (receiver x, receiver y), and wherein x and y refer to natural directions of acquisition, the method comprising:
    applying a first pass of a 4-dimensional (4D) regularization technique to a first plurality of subsets of a seismic survey to generate finely sampled regularized seismic data, wherein the first plurality of subsets comprises piecewise continuous sets of seismic data recorded by a single receiver line, and wherein an output spacing of the first pass along a crossline offset dimension is set equal to both an output spacing of the first pass along an offset inline dimension and an output spacing of the first pass along a shot x dimension;
    applying a first F-Kx-Ky anti-alias dip reject filter to the finely sampled regularized seismic data;
    decimating an output of the first F-Kx-Ky anti-alias dip reject filter back to an equivalent field spacing of $\Delta$ receiver x and Δ shot y, thereby maintaining a new regular spacing in crossline offset, inline offset, and receiver x, wherein Δ crossline offset=Δ inline offset=Δ shot x=field Δ receiver x;

sorting the decimated seismic data into a second plurality of subsets that share a common value of shot x;

applying a second pass of the 4D regularization technique to the second plurality of subsets, thereby achieving regularization of the fourth spatial coordinate receiver y;

sorting the second plurality of subsets of the 4D regularization technique into a plurality of common midpoint (CMP) gathers;

applying, within each of the CMP gathers, a 3-dimensional (3D) regularization technique to further reduce the previously regularized sampling of Δ crossline offset and Δ inline offset, wherein an output spacing along each regularized dimension is set equal to the field spacing Δ receiver x;

applying a second F-Kx-Ky anti-alias dip reject filter to the regularized CMP gathers; and decimating an output of the second F-Kx-Ky anti-alias dip reject filter back to an inline and crossline offset sampling equal to twice a minimum of the field spacings Δ shot x and Δ receiver y to create full waveform de-aliased gathers.

2. The method of claim 1, further comprising:
applying normal moveout (NMO) corrections to the seismic data prior to applying the first 4D regularization to the first portion of seismic data.

3. The method of claim 1, wherein the first 4D regularization technique comprises:
regularizing shot x, offset crossline, and offset inline dimensions of the first seismic data, wherein:

the offset crossline=(shot $y$–receiver $y$), and the offset inline=(receiver $x$–shot $x$).

4. The method of claim 3, wherein the first 4D regularization technique further comprises:
based on regularized receiver x values, assigning output receiver y values based upon interpolating a table of receiver x and receiver y values extracted from the input dataset.

5. The method of claim 1, wherein the first $F-K_x-K_y$ anti-alias dip reject filter is configured to filter low velocity surface waves.

6. The method of claim 1, wherein applying the second 4D regularization technique to the subsets comprises:
regularizing receiver y, offset crossline, and offset inline dimensions of the subsets.

7. The method of claim 6, wherein an output spacing of the regularized receiver y dimension is set equal to the output spacing of the regularized receiver x dimension.

8. The method of claim 1, wherein the second $F-K_x-K_y$ anti-alias dip reject filter is configured to reject high apparent velocities.

9. The method of claim 1, further comprising:
constructing a model of noise in the seismic data; and
adaptively subtracting the noise from the seismic data.

10. A device comprising:
one or more processors; and
a non-transitory computer-readable storage medium coupled to the one or more processors and storing programming instructions for execution by the one or more processors, the programming instructions instructing the one or more processors to perform operations comprising:
applying a first pass of a 4-dimensional (4D) regularization technique to a first plurality of subsets of a seismic survey to generate finely sampled regularized seismic data, wherein the first plurality of subsets comprises piecewise continuous sets of seismic data recorded by a single receiver line, and wherein an output spacing of the first pass along a crossline offset dimension is set equal to both an output spacing of the first pass along an offset inline dimension and an output spacing of the first pass along a shot x dimension;

applying a first F-Kx-Ky anti-alias dip reject filter to the finely sampled regularized seismic data;

decimating an output of the first F-Kx-Ky anti-alias dip reject filter back to an equivalent field spacing of Δ receiver x and Δ shot y, thereby maintaining a new regular spacing in crossline offset, inline offset, and receiver x, wherein Δ crossline offset=Δ inline offset=Δ shot x=field Δ receiver x;

sorting the decimated seismic data into a second plurality of subsets that share a common value of shot x;

applying a second pass of the 4D regularization technique to the second plurality of subsets, thereby achieving regularization of the fourth spatial coordinate receiver y;

sorting the second plurality of subsets of the 4D regularization technique into a plurality of common midpoint (CMP) gathers;

applying, within each of the CMP gathers, a 3-dimensional (3D) regularization technique to further reduce the previously regularized sampling of Δ crossline offset and Δ inline offset, wherein an output spacing along each regularized dimension is set equal to the field spacing Δ receiver x;

applying a second F-Kx-Ky anti-alias dip reject filter to the regularized CMP gathers; and decimating an output of the second anti-alias dip reject F-Kx-Ky filter back to an inline and crossline offset sampling equal to twice a minimum of the field spacings Δ shot x and Δ receiver y to create full waveform de-aliased gathers.

11. The device of claim 10, wherein the operations further comprise:
applying normal moveout (NMO) corrections to the seismic data prior to applying the first 4D regularization to the first portion of seismic data.

12. The device of claim 10, wherein the first 4D regularization technique comprises:
regularizing shot x, offset crossline, and offset inline dimensions of the first seismic data, wherein:

the offset crossline=(shot $y$–receiver $y$), and the offset inline=(receiver $x$–shot $x$).

13. The device of claim 12, wherein the first 4D regularization technique further comprises:
based on regularized receiver x values, assigning output receiver y values based upon interpolating a table of receiver x and receiver y values extracted from the input dataset.

14. The device of claim 10, wherein applying the second 4D regularization technique to the subsets comprises:

regularizing receiver y, offset crossline, and offset inline dimensions of the subsets.

15. A non-transitory computer-readable medium storing instructions executable by a computer system to perform operations comprising:
applying a first pass of a 4-dimensional (4D) regularization technique to a first plurality of subsets of a seismic survey to generate finely sampled regularized seismic data, wherein the first plurality of subsets comprises piecewise continuous sets of seismic data recorded by a single receiver line, and wherein an output spacing of the first pass along a crossline offset dimension is set equal to both an output spacing of the first pass along an offset inline dimension and an output spacing of the first pass along a shot x dimension;
applying a first F-Kx-Ky anti-alias dip reject filter to the finely sampled regularized seismic data;
decimating an output of the first F-Kx-Ky anti-alias dip reject filter back to an equivalent field spacing of $\Delta$ receiver x and $\Delta$ shot y, thereby maintaining a new regular spacing in crossline offset, inline offset, and receiver x, wherein $\Delta$ crossline offset=$\Delta$ inline offset=$\Delta$ shot x=field $\Delta$ receiver x;
sorting the decimated seismic data into a second plurality of subsets that share a common value of shot x;
applying a second pass of the 4D regularization technique to the second plurality of subsets, thereby achieving regularization of the fourth spatial coordinate receiver y;
sorting the second plurality of subsets of the 4D regularization technique into a plurality of common midpoint (CMP) gathers;
applying, within the CMP gathers, a 3-dimensional (3D) regularization technique to further reduce the previously regularized sampling of $\Delta$ crossline offset and $\Delta$ inline offset, wherein an output spacing along each regularized dimension is set equal to the field spacing $\Delta$ receiver x;
applying a second F-Kx-Ky anti-alias dip reject filter to the regularized CMP gathers; and
decimating an output of the second F-Kx-Ky anti-alias dip reject filter back to an inline and crossline offset sampling equal to twice a minimum of the field spacings $\Delta$ shot x and $\Delta$ receiver y to create full waveform de-aliased gathers.

16. The non-transitory computer-readable medium of claim 15, wherein the first F-$K_x$-$K_y$ anti-alias dip reject filter is configured to filter low velocity surface waves.

17. The non-transitory computer-readable medium of claim 15, wherein applying the second 4D regularization technique to the subsets comprises:
regularizing receiver y, offset crossline, and offset inline dimensions of the subsets.

18. The non-transitory computer-readable medium of claim 17, wherein an output spacing of the regularized receiver y dimension is set equal to the output spacing of the regularized receiver x dimension.

19. The non-transitory computer-readable medium of claim 15, wherein the second F-$K_x$-$K_y$ anti-alias dip reject filter is configured to reject high apparent velocities.

20. The non-transitory computer-readable medium of claim 15, the operations further comprising:
constructing a model of noise in the seismic data; and
adaptively subtracting the noise from the seismic data.

* * * * *